United States Patent [19]
Lange

[11] Patent Number: 6,064,866
[45] Date of Patent: May 16, 2000

[54] SWITCHABLE BANDPASS FILTER FOR A MULTIBAND TUNER

[75] Inventor: Joachim Lange, Krefeld, Germany

[73] Assignee: U.S. Philips Corporation, New York, N.Y.

[21] Appl. No.: 08/882,870

[22] Filed: Jun. 26, 1997

[30] Foreign Application Priority Data

Jul. 12, 1996 [DE] Germany .................. 196 28 186

[51] Int. Cl.[7] .................. H04B 1/18; H04B 1/16; H04B 1/06
[52] U.S. Cl. .................. 455/180.1; 455/188.1; 455/193.2; 455/193.3; 455/266; 455/339; 455/340
[58] Field of Search .................. 455/180.1, 180.4, 455/188.1, 193.1, 193.2, 193.3, 266, 339, 340

[56] References Cited

U.S. PATENT DOCUMENTS

| | | | |
|---|---|---|---|
| 4,573,211 | 2/1986 | Kupfer | 455/180.1 |
| 4,905,306 | 2/1990 | Anderson | 455/340 |
| 4,972,509 | 11/1990 | Maejima | 455/180.1 |
| 5,752,179 | 5/1998 | Dobrovolny | 455/266 |
| 5,835,853 | 12/1998 | Enoki et al. | 455/180.1 |

FOREIGN PATENT DOCUMENTS

| | | |
|---|---|---|
| 0429914 | 6/1991 | European Pat. Off. . |
| 3939741 | 6/1991 | Germany . |
| 2196198 | 4/1988 | United Kingdom . |

*Primary Examiner*—Dwayne D. Bost
*Assistant Examiner*—Quochien B. Vuong
*Attorney, Agent, or Firm*—Michael E. Marion

[57] ABSTRACT

To achieve a high passband attenuation, a switchable bandpass filter for a multiband tuner, includes at least a capacitance diode for frequency-tuning of at least a resonant circuit of the bandpass filter, and a switching diode arranged at the input and the output, this switching diode being switchable to either the blocked state or to the conducting state by DC voltages. The capacitance diode is additionally usable for blocking the bandpass filters and is integrated in the resonant circuit of the bandpass filter in such a way that, in dependence upon a switching potential, the capacitance diode couples the resonant.

10 Claims, 1 Drawing Sheet

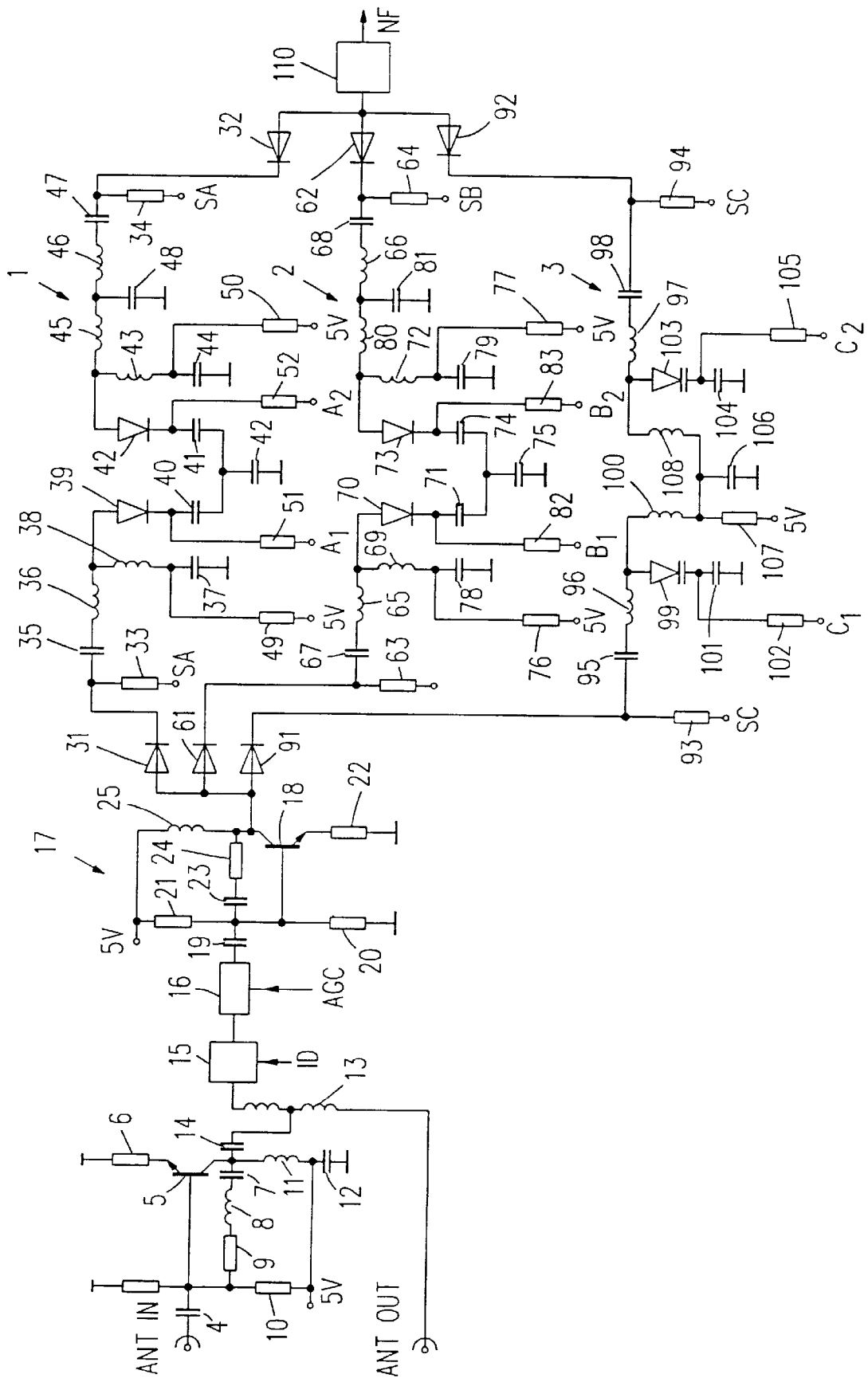

SWITCHABLE BANDPASS FILTER FOR A MULTIBAND TUNER

BACKGROUND OF THE INVENTION

1. Field of the Invention

The invention relates to a switchable bandpass filter for a multiband tuner, comprising at least a capacitance diode for frequency-tuning of at least a resonant circuit of the bandpass filter, and a switching diode arranged at the input and the output, said switching diode being switchable to either the blocked state or to the conducting state by means of DC voltages.

2. Description of the Related Art

A tuner circuit including two parallel-arranged switchable bandpass filters is described in German Patent Specification 39 39 741. In this circuit, the switching is performed by means of switching diodes arranged at the input and the output of the bandpass filters. Furthermore, capacitance diodes for tuning the bandpass filters are provided within these bandpass filters. It is true that the switching diodes can improve the mutual decoupling of the bandpass filters, but the blocked bandpass filter also has a relatively low passband attenuation so that not only the signal of the bandpass filter which is switched on appears at the junction point of the two bandpass filters, but also the signal of the bandpass filter which is apparently switched off appears to an insufficiently attenuated extent. Thus, the frequency range processed by the blocked bandpass filter is not sufficiently attenuated.

SUMMARY OF THE INVENTION

It is an object of the invention to provide switchable bandpass filters which not only have a satisfactory mutual decoupling, but also a satisfactory passband attenuation in the blocked state.

According to the invention, this object is solved in that the capacitance diode is additionally usable for blocking the bandpass filters and is integrated in the resonant circuit of the bandpass filter in such a way that, in dependence upon a switching potential, the capacitance diode couples the resonant circuit to the switching potential. The capacitance diode in the bandpass filter according to the invention is also used to tune the frequency of the bandpass filter. To this end, a variable voltage is applied, in dependence upon which the capacitance of the capacitance diode is changed and thus changes the resonance frequency of the resonant circuit of the bandpass filter. Moreover, the capacitance diode is additionally used to improve the extent of the blocked state of the bandpass filter, i.e., particularly to increase the passband attenuation. To this end, the capacitance diode is arranged in such a way that, after the supply of a switching potential, this diode couples the resonant circuit of the bandpass filter to a switching potential. As a result, all signal components, which, in spite of the switching diodes, reach the bandpass filter, are drained via the switching potential. This measure improves the passband attenuation in the blocked state of the bandpass filter to a considerable extent; 50 to 60 dB of passband attenuation can be achieved by this measure.

An embodiment of the invention is characterized in that, for blocking the bandpass filter, the capacitance diode is switched to the conducting state by means of the switching potential, and couples the resonant circuit to the switching potential.

The capacitance diode may be particularly arranged in such a way that it is switched to the conducting state by applying the switching potential and thus couples voltages or signals occurring in the resonant circuit to the switching potential. In this state, the capacitance diode operates at a low impedance and, if a switching potential is not applied, it can be operated in the range in which its capacitance is variable in dependence upon an applied tuning voltage.

A further embodiment of the invention is characterized in that the capacitance diode is coupled to a positive DC voltage at the anode end and to the switching potential at the cathode end and, via at least a capacitor, to the reference potential.

If the bandpass filter is not in the blocked state, the capacitance diode is operated in its conducting state in the transition range. By varying the voltage, the capacitance changes and the diode can be used for tuning the resonant circuit of the bandpass filter. If the switching potential at the cathode end is activated, the capacitance diode becomes completely conducting and drains alternating voltages existing in the resonant circuit via the reference potential.

In the unblocked state of the bandpass filter, the capacitance diode constitutes a part of the resonant circuit of the bandpass filter, to which end, a further embodiment of the invention is characterized in that the capacitance diode is coupled at the anode end to at least an inductance of the resonant circuit.

In the unblocked state of the bandpass filter, the capacitance diode is used for frequency-tuning of the bandpass filter. To this end, a further embodiment of the invention is characterized in that a tuning voltage for frequency-tuning of the bandpass filter is applied to the cathode of the capacitance diode. Dependent on this tuning voltage, the capacitance diode changes its capacitance.

The above-described advantages of the switchable bandpass filter particularly become manifest when this filter is used in a multiband tuner. In such a tuner, a plurality of bandpass filters is generally arranged in parallel. The bandpass filter according to the invention not only achieves a satisfactory mutual decoupling of the bandpass filters in this case, but also a satisfactory passband attenuation of the bandpass filters that are blocked. Particularly, a further embodiment of the invention for such a multiband tuner is characterized in that the tuner is provided with a broadband amplifier preceding at least two switchable bandpass filters.

Due to the low impedance of the broadband amplifier, the effect of the switching diodes can be further enhanced in that they can be better blocked and thus a better decoupling of the bandpass filters is achieved.

These and other aspects of the invention are apparent from and will be elucidated with reference to the embodiments described hereinafter.

BRIEF DESCRIPTION OF THE DRAWINGS

In the drawing:

The sole FIGURE shows a schematic diagram of a multiband tuner having three parallel-arranged bandpass filters according to the invention.

DESCRIPTION OF THE PREFERRED EMBODIMENT

The sole FIGURE shows a multiband tuner with three parallel-arranged switchable bandpass filters 1, 2 and 3. The three bandpass filters have a structure in accordance with the invention and are implemented for different frequency ranges. Each time, only one of the three bandpass filters 1, 2, 3 is activated; the other two bandpass filters are blocked.

In the blocked state, these bandpass filters should have a maximal passband attenuation for signals present at the input. Moreover, to preclude mutual influence, the filters should be satisfactorily decoupled with respect to each other.

An RF input signal is applied to the antenna input ANT IN of the tuner shown in the FIGURE. This input signal is received at the base of a PNP transistor 5 via a coupling capacitor 4, the emitter of said transistor being coupled to the reference potential via a resistor 6. This input stage comprises a filter consisting of the series arrangement of a capacitor 7, an inductance 8 and a resistor 9 between the collector of the transistor 5 and the junction point of the capacitor 4 and the base of transistor 5. This junction point is further coupled to the power supply potential (5 V) via a resistor 10. The collector is further coupled to the reference potential via a series arrangement of an inductance 11 and a capacitor 12.

A component of this input circuit with the transistor 5 is a power splitter which is built up by means of an inductance 13 having a central tap 14. The collector of the transistor 5 is coupled to this central tap on the inductance 13 via a capacitor 14. A first final tap on the inductance 13 constitutes an output which is denoted by ANT OUT in the FIGURE and to which the antenna signal is applied as an output signal. Such a circuit is required, for example, for video recorders in which the antenna input signal should be made additionally available as an output signal for a television receiver.

A second final tap on the inductance 13 is applied to an RF circuit 15 which performs a very broad preselection.

This RF circuit 15 precedes an amplifier or attenuation element 16 having an adjustable gain or attenuation. This amplifier or attenuation element 16 receives a signal AGC for automatic gain control which controls the amplifier or attenuation element 16 in dependence upon tuner circuit elements (not shown) in such a way that a desired gain is achieved in the tuner.

The amplifier or attenuation element 16 precedes a broadband amplifier 17 having an amplifying transistor 18. The base of this transistor is connected to the output of the amplifier or attenuation element 16 via a coupling capacitor 19. The base is further coupled to the reference potential via a resistor 20 and to the power supply potential +5 V via a resistor 21. The emitter of the transistor 18 is connected to the reference potential via a resistor 22. The collector and the base of the transistor 18 are coupled together via a capacitor 23 and a resistor 24. The collector is further coupled to the power supply potential via an inductance 25.

The broadband amplifier 17 with the transistor 18 has a lower input and output impedance of, preferably, less than 100 Ohms. The operation of the subsequent bandpass filters can be improved thereby. Particularly, these bandpass filters can be better decoupled in the blocked state.

The broadband amplifier 17 precedes a parallel arrangement of the three switchable and tunable bandpass filters 1, 2 and 3.

The first bandpass filter 1 comprises a switching diode 31 at the input and a switching diode 32 at the output. A switching voltage SA may be supplied behind the switching diode 31 at the input and via a resistor 33. In a corresponding manner, this is effected at the output via a resistor 34. By means of the switching signal SA, the switching diodes 31 and 32 at the input and the output, respectively, can be switched to the blocked state so that a relatively satisfactory mutual decoupling of the filters is achieved. However, the switching diodes 31 and 32 do not yet yield a very satisfactory passband attenuation of the bandpass filter.

The bandpass filter 1 shown in the FIGURE has a coupling capacitor 35 at its input and precedes a coupling inductance 36. The tunable resonant circuit of the bandpass filter 1 consists of an inductance 38 coupled to the reference potential via a capacitor 37 and a capacitance diode 39 coupled to this inductance at the anode end and a capacitor 40 connected to this inductance at the cathode end. The junction point between the inductance 38 and the capacitance diode 39 is connected to the coupling inductance 36.

The bandpass filter 1 further comprises a second resonant circuit which is constructed in a corresponding manner. A capacitor 41 is provided which is connected to the capacitor 40. The capacitor 41 is coupled to the cathode of a second capacitance diode 42 which is connected to a resonant circuit inductance 43 at the anode end, which inductance is coupled to the reference potential via a capacitor 44.

The junction point between the capacitors 40 and 41 is coupled to the reference potential via a capacitor 42. At the output, the bandpass filter 1 comprises a low-pass filter whose inductance 45 is coupled to the junction point between the anode of the capacitance diode 42 and the resonant circuit inductance 43. At the output, the inductance 45 is coupled to the reference potential via a capacitor 48. A low-pass filter with an inductance 46 and a capacitor 47 follows. The switching diode 32 is arranged behind the coupling capacitor 47.

In both resonant circuits, a positive power supply voltage (5 V) is applied via resistors 49 and 50 to the junction points between the inductance 38 and the capacitor 37 and between the inductance 43 and the capacitor 44, respectively.

Furthermore, tuning voltages $A_1$, $A_2$ are applied via resistors 51 and 52 to the junction points between the cathode of the capacitance diode 39 and the capacitor 40 and to the junction point between the cathode of the capacitance diode 42 and the capacitor 41.

For operation in the conducting state, the switching signals SA are deactivated. Moreover, tuning voltages $A_1$ and $A_2$ are applied, which operate the capacitance diodes 39 and 42 in their blocked state in such a way that their capacitance changes. The resonance frequency of the resonant circuits is then changed and the bandpass filters can be subsequently tuned.

For blocking the bandpass filter 1, the switching signals SA are activated. As a result, the diodes 31 and 32 are switched to their blocked state. Instead of the tuning voltages, a switching potential which is preferably proximate to, or below the reference potential is additionally applied to the inputs $A_1$ and $A_2$. The capacitance diodes 39 and 42 are then completely switched to their conducting state so that signals present in the resonant circuits of the bandpass filter 1 are drained via the reference potential or via this switching potential. A satisfactory additional passband attenuation of the bandpass filter 1 is thereby achieved.

In the embodiment shown in the FIGURE, the two further bandpass filters 2 and 3 are provided for other frequency ranges.

The bandpass filter 2 comprises a switching diode 61 at the input and a switching diode 62 at the output. These diodes can be activated by means of switching signals SB via resistors 63 and 64, respectively.

The tunable resonant circuits of the bandpass filter 2 are constructed in the same way as those of the bandpass filter 1. The bandpass filter 2 comprises coupling inductances 65 and 66 and coupling capacitors 67 and 68 at the input and the output. The resonant circuits also have the same structure as those in bandpass filter 1. The first resonant circuit comprises an inductance 69, a capacitance diode 70 and a capacitor 71. The second resonant circuit comprises an inductance 72, a capacitance diode 73 and a capacitor 74. The junction point between the capacitors 71 and 74 is coupled to reference potential via a capacitor 75. The power supply voltages are applied via resistors 76 and 77 to the junction point between the resonant circuit inductance 69 and a capacitor 78 coupled to the reference potential and to the junction point between the resonant circuit inductance 72 and a capacitor 79, respectively. At the output, the bandpass filter 2 also comprises a low-pass filter consisting of an inductance 80 and a capacitor 81. Tuning voltages $B_1$ and $B_2$ or the switching potential are applied via resistors 82 and 83.

The third bandpass filter 3 also comprises switching diodes 91 and 92 at the input and the output. These diodes are switchable to the blocked state via switching signals SC which can be applied via resistors 93 and 94. At the input, the bandpass filter 3 comprises a coupling capacitor 95 and a coupling inductance 96. A coupling inductance 97 a coupling capacitor 98 are also arranged at the output. A capacitance diode 99, which is coupled to an inductance 100 and to the coupling inductance 96 at the anode end, is provided for the first resonant circuit of the bandpass filter 3. At the anode end, the capacitance diode 99 is coupled to the reference potential via a capacitor 101 and to an input signal $C_1$ via a resistor 102, which input signal may be again either the tuning voltage or the switching potential.

A capacitance diode 103, which is coupled to the coupling inductance 97 and to a resonant circuit inductance 108 at the anode end, is provided for the second resonant circuit.

Also the capacitance diode 103 is coupled to the reference potential via a capacitor 104 and to the tuning or switching potential via a resistor 105.

The junction point between the inductances 100 and 108 is coupled to the reference potential via a capacitor 106 and to the power supply potential (+5 V) via a resistor 107.

Also in the bandpass filter 3, the inputs $C_1$, $C_2$ may receive a tuning voltage which is chosen to be such that the capacitance diodes 99 and 103 change their capacitance in dependence upon this voltage, so that the tuning frequency of the resonant circuits of the bandpass filter 3 can be changed. However, if the switching potential is applied to the inputs $C_I$, $C_2$, the diodes 99 and 103 are completely switched to their conducting state so that all signals are drained via this switching potential.

At the output, the three bandpass filters 1, 2 and 3 precede a mixer 110 which is shown only diagrammatically in the FIGURE and whose output supplies a low-frequency signal NF.

Of the three bandpass filters 1, 2 and 3, only one is activated at any time, i.e., the two other bandpass filters are switched to the blocked state. Thus, the two other bandpass filters which are switched to the blocked state are additionally blocked by means of the switching signals SA, SB or SC applied to the switching diodes 31, 61, 91 and 32, 62, 92 at the input and the output, respectively. A relatively satisfactory mutual decoupling of the bandpass filters is already achieved by these switching diodes. However, the passband attenuation remains insufficient so that also the blocked bandpass filter still supplies signal residues at the output.

To improve this passband attenuation, the switching diodes 39, 42, 70, 73 and 99, 103 are arranged in such a way that they not only serve as capacitance diodes for tuning the resonant circuits, but also serve for blocking the bandpass filters or for draining signals applied to the bandpass filters. To this end, these switching diodes are switched to their conducting state so that they drain these signals via the switching potential. This also leads to a high passband attenuation so that the deactivated bandpass filters in the overall circuit are actually no longer operative and only the bandpass filter which is switched on and is supposed to be active is operative.

I claim:

1. A switchable bandpass filter for a multiband tuner, comprising at least a capacitance diode for frequency-tuning at least a resonant circuit of the bandpass filter, and a first switching diode arranged at an input of the switchable bandpass filter , an a second switching diode arranged at an output of said switchable bandpass filter, said first and second switching diodes being switchable to either a blocked state or to a conducting state by means of DC voltages, characterized in that the capacitance diode is additionally usable for blocking the bandpass filter and is integrated in the resonant circuit of the bandpass filter in such a way that, in dependence upon a switching potential, the capacitance diode couples the resonant circuit to a switching potential.

2. A switchable bandpass filter as claimed in claim 1, characterized in that, for blocking the bandpass filter, the capacitance diode is switched to the conducting state by means of the switching potential and couples the resonant circuit to the switching potential.

3. A switchable bandpass filter as claimed in claim 1, characterized in that the capacitance diode is coupled to a positive DC voltage at an anode end and to the switching potential at a cathode end and, via at least a capacitor, to a reference potential.

4. A switchable bandpass filter as claimed in claim 1, characterized in that the capacitance diode is coupled at an anode end to at least an inductance of the resonant circuit.

5. A switchable bandpass filter as claimed in claim 1, characterized in that, in the case of an inactive switching potential, a tuning voltage for frequency-tuning of the bandpass filter is applied to a cathode of the capacitance diode.

6. A switchable bandpass filter as claimed in claim 1, characterized in that at least two capacitance diodes are provided.

7. A multiband tuner comprising at least one switchable bandpass filter as claimed in claim 1.

8. A multiband tuner comprising at least two switchable bandpass filters as claimed in claim 1, characterized in that switching between the bandpass filters is performed in such a way that only one bandpass filter is activated at any time and that the other bandpass filters are switched to the blocked state by means of the switching potentials.

9. A multiband tuner as claimed in claim 8, characterized in that the bandpass filters which are switched to the blocked state by means of the capacitance diodes are additionally blocked by means of the first and second switching diodes.

10. A multiband tuner as claimed in claim 8, characterized in that the tuner includes a broadband amplifier preceding said at least two switchable bandpass filters.

* * * * *